(12) United States Patent
Bret et al.

(10) Patent No.: US 6,181,197 B1
(45) Date of Patent: Jan. 30, 2001

(54) BANDPASS FILTER WITH TRANSCONDUCTORS

(75) Inventors: Gérard Bret, Echirolles; Pascal Debaty, Domene, both of (FR)

(73) Assignee: STMicroelectronics S.A., Gentilly (FR)

( * ) Notice: Under 35 U.S.C. 154(b), the term of this patent shall be extended for 0 days.

(21) Appl. No.: 09/304,384

(22) Filed: May 4, 1999

(30) Foreign Application Priority Data

May 5, 1998 (FR) .................................................. 98 05886

(51) Int. Cl.[7] ...................................................... H03K 5/00

(52) U.S. Cl. ............................ 327/557; 327/553; 327/552

(58) Field of Search .................................... 327/552, 557, 327/553; 330/305

(56) References Cited

U.S. PATENT DOCUMENTS

| | | | |
|---|---|---|---|
| 5,001,441 | 3/1991 | Gen-Kong | 330/294 |
| 5,317,217 | * 5/1994 | Rieger et al. | 327/552 |

OTHER PUBLICATIONS

Urbaé et al., *IEEE Transactions on Consumer Electronics*, "High Frequency Realization of C–OTA Second Order Active Filters", May 10–12, 1982, P1106–1109, p. 1106, col. 1, line 9, figure 2.

Tanabe et al, *IEEE Transactions on Consumer Electronics*, "A Single Chip Y/C Signal Processing IC for VHS VCRS", vol. 35, No. 4, pp. 741–747, p. 743, col. 1, line 7, p. 744, col. 1, line 23, figure 6.

\* cited by examiner

*Primary Examiner*—Dinh T. Le
(74) *Attorney, Agent, or Firm*—Theodore E. Galanthay; Allen, Dyer, Doppelt, Milbrath & Gilchrist, P.A.

(57) ABSTRACT

A bandpass filter includes a first and a second transconductor. The first transconductor has a first input connected to ground, and a second input connected to a second input of the second transconductor and to the output of the filter. An output of the first transconductor is connected to a first input of the second transconductor, and to an input of a filter through a first capacitor. The output of the second transconductor is connected to ground through a second capacitor, and to a monitor amplifier. An output of the monitor amplifier is connected to the output of the filter. The bandpass filter further includes a third capacitor arranged between the second input and the output of the first transconductor, and a splitter bridge connected to the second input of the second transconductor.

16 Claims, 1 Drawing Sheet

BANDPASS FILTER WITH TRANSCONDUCTORS

FIELD OF THE INVENTION

This invention relates to the field of electronics and, more particularly, to a bandpass filter.

BACKGROUND OF THE INVENTION

Demodulation systems for the chrominance subcarrier of a video signal require use of bandpass filters accepting a signal with a relatively large dynamic range. The bandpass filters have quality coefficients defining the selectivity of these filters. These quality coefficients are relatively high, e.g., within the range 3 to 30.

In prior art demodulator circuits, these filters can be produced using integrated capacitors and transconductors. A transconductor is defined by its transconductance $g_m$ such that its output current $i_s = g_m * v_e$. The variable $v_e$ is the voltage between the two input terminals. These transconductors must be able to be regulated to adjust the center frequency of the filter. The control of transconductance is provided by a servoloop using a filter structure analogous to that of the filter to be adjusted and a precise frequency reference.

A traditional example of a bandpass filter is illustrated in FIG. 1, and is described in an article titled "Active Filter Design Using Operational Transconductance Amplifiers: A Tutorial," by Randall L. Geiger and Edgar Sanchez-Sinencio, published in IEEE Circuits and Devices Magazine, March 1985, pages 20–32. More particularly, a description of this bandpass filter can be found in this reference on the final two lines on page 25, and the first fifteen lines on page 27 viewed with FIG. 7(a) therein. This reference discloses various structures for circuits (e.g., voltage controlled amplifiers, filters, etc.) based on transconductors for integration.

The filter illustrated in FIG. 1 includes first and second transconductors 10 and 11, respectively with transconductances $g_{m1}$ and $g_{m2}$. The first input (+) of the first transconductor 10 is connected to ground. The second input (−input or reverse input) of the first transconductor 10 is connected to the second input (−input or reverse input) of the second transconductor 11, and to the output S of the filter. The output of the first transconductor 10 is connected to the first input (+) of the second transconductor 11, and to the input E of the filter through a first capacitor C1. The output of the second transconductor 11 is connected to ground through a second capacitor C2, and to a monitor amplifier 12. The output of the monitor amplifier 12 is connected to the output S of the filter.

This filter can be formed, for monolithic applications, in MOS or bipolar technologies. The transfer function of this filter is such that:

$$\frac{V_s}{V_e} = \frac{\frac{C_1}{g_{m1}} \cdot p}{\frac{C_1 \cdot C_2}{g_{m1} \cdot g_{m2}} \cdot p^2 + \frac{C_1}{g_{m1}} \cdot p + 1}$$

The variable p is the Laplace variable with the resonant frequency defined as follows:

$$\omega_0 = \sqrt{\frac{g_{m1} \cdot g_{m2}}{C_1 \cdot C_2}}$$

The variable $\omega_0$ can be adjusted as a result of regulating $g_{m1}$ and $g_{m2}$.

The quality coefficient is such that:

$$Q = \sqrt{\frac{g_{m1} \cdot C_2}{g_{m2} \cdot C_1}}$$

By choosing the transconductances $g_{m1}$ and $g_{m2}$ so that the ratio $g_{m1}/g_{m2}$ remains constant, a quality coefficient value Q that is independent of $\omega_0$ is obtained. To provide a precise adjustment of $\omega_0$, it is then necessary to vary the transconductances $g_{m1}$ and $g_{m2}$ in the same proportions, and to ensure the best possible matching between the transconductances $g_m$ of this filter and the transconductances $g_m$ of the servo-loop filter.

Firstly, this leads to a limiting of the ratio $g_{m1}/g_{m2}$ to a value that does not exceed 4. The value of the quality coefficient can then be fixed by choosing the ratio $C_2/C_1$. In order to obtain a high quality coefficient, the ratio $C_2/C_1$ must be large. This is incompatible with the constraints of circuit integration. In effect, poor matching of $C_{1 \ and \ C2}$ is obtained if $C_2 >> C_1$. The parasitic capacitances which are the same size as $C_1$ cause inaccuracy in the filter.

The output node 13 from the first transconductor 10 is particularly critical. In effect, it is at a high impedance. Small parasitic capacitances can cause changes in filter characteristics. Furthermore, a large overvoltage linked to the quality factor develops at this node 13.

At resonance $\omega = \omega_0$, the voltage $v_{c1}$ this node 13 is of the form:

$$\frac{v_{c1}}{V_e} = 1 + jQ$$

$$\left|\frac{v_{c1}}{V_e}\right| = \sqrt{1+Q^2} \approx Q$$

The input voltage dynamic range $v_e$ is then Q times less than the output dynamic range of the first transconductor 10. Such a limitation means that a high penalty is paid in circuits with a low supply voltage.

SUMMARY OF THE INVENTION

The object of the present invention is to provide a bandpass filter that allows one to avoid the above described disadvantages by permitting a significant improvement in its performance.

The present invention thus relates to a bandpass filter including first and second transconductors. The first input of the first transconductor is connected to ground. The second input of the first transconductor is connected to the second input of the second transconductor, and to the output of the filter. The output of the first transconductor is connected to the first input of the second transconductor, and to the input of the filter through a first capacitor. The output of the second transconductor is connected to ground through a second capacitor, and to a monitor amplifier. An output of the monitor amplifier is connected to the output of the filter. The bandpass filter further includes a third capacitor connected between the second input and the output of the first transconductor. A resistance bridge is also connected to the second input of the second transconductor, and to a common point between the second input of the first transconductor and the output of the filter. A second resistance is arranged between this second input of the second transconductor and ground.

Advantageously, the respective values of the first, second and third capacitors are such that:

$C_1 = m \cdot C_0$ $C_2 = C_0$ $C_3 = (1-m) C_0$

Advantageously, the following relationships apply:

$0.1 < m < 0.5$ and $1.1(1-m) < k < 0.9$ with $k = R2/(R1+R2)$, and R1 and R2 being the respective values of the first and second resistances.

This invention also relates to a television processing integrated circuit that includes at least one filter as specified above.

DETAILED DESCRIPTION OF THE PREFERRED EMBODIMENTS

Figure 1:
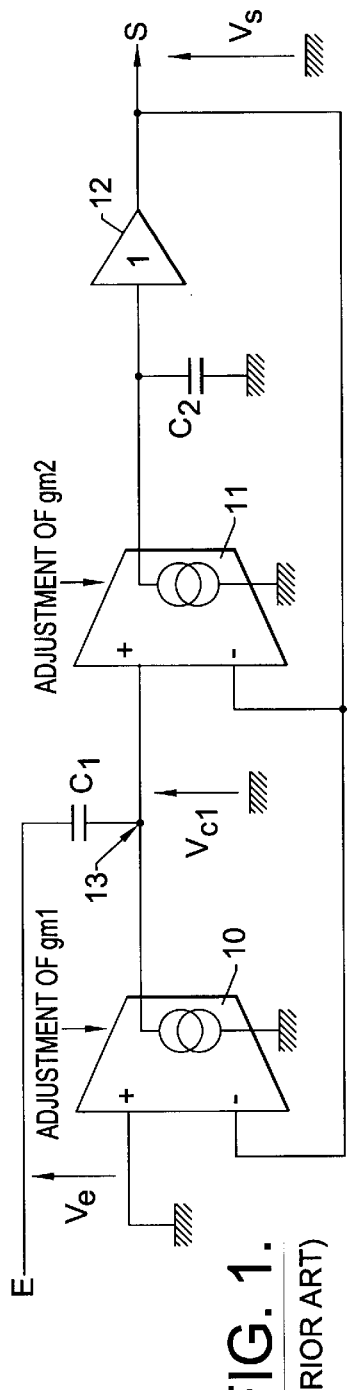
FIG. 1 illustrates a bandpass filter according to the prior art.
Figure 2:
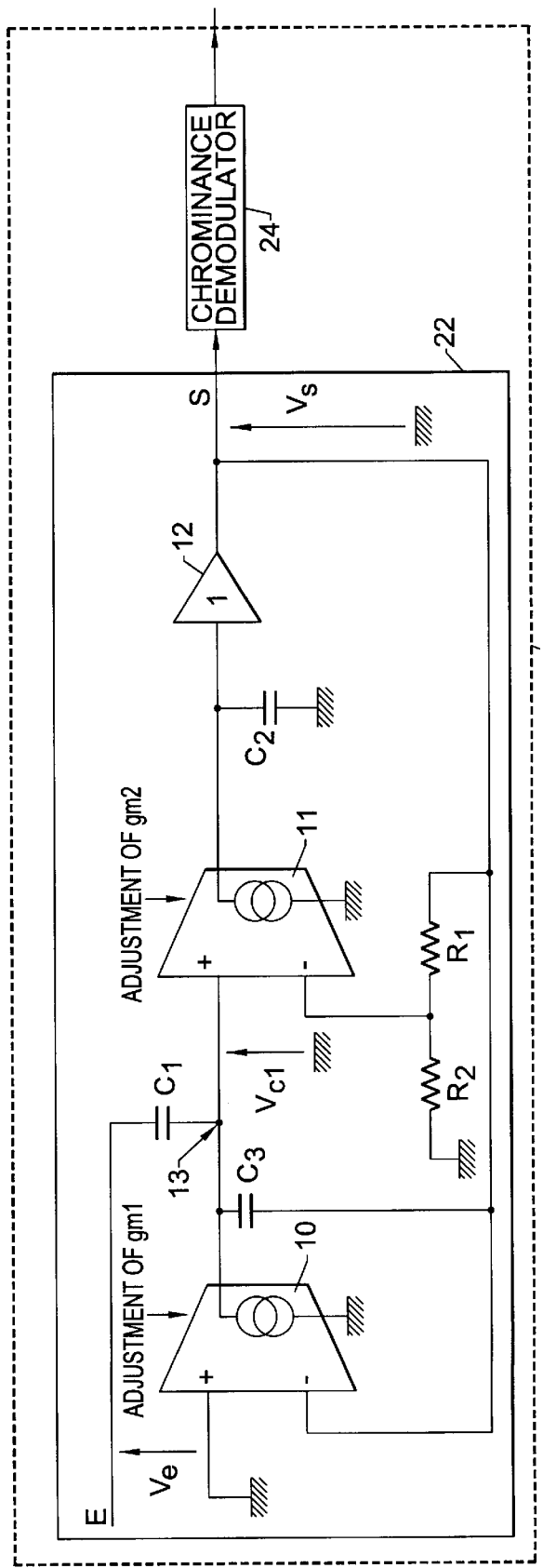
FIG. 2 illustrates a bandpass filter according to the present invention.

The filter of the present invention is of the same type as the filter illustrated in FIG. 1. However, a third capacitor $C_3$ is introduced between the second input and the output of the first transconductor 10, and a splitter bridge R1, R2 is connected to the second input of the second transconductor as illustrated in FIG. 2. FIG. 2 also illustrates the bandpass filter 22 included within a television processing circuit 20. The bandpass filter 22 receives and filters a chrominance subcarrier of a video signal before applying the filtered signal to a chrominance demodulator 24. A first resistance R1 is arranged between this second input of the second transconductor 11, and the common point between the second input of the first transconductor 10 and the output of the filter. A second resistance R2 is connected between this second input of the second transconductor 11 and ground.

The transfer function is then such that:

$$\frac{v_s}{v_e} = \frac{C_1}{k \cdot (C_1 + C_3) - C} \cdot \frac{\frac{k \cdot (C_1 + C_3) - C_3}{g_{m1}} \cdot p}{\frac{(C_1 + C_3) \cdot C_2}{g_{m1} \cdot g_{m2}} \cdot p^2 + \frac{k \cdot (C_1 + C_3) - C_3}{g_{m1}} \cdot p + 1}$$

with:

$$k = \frac{R_2}{R_1 + R_2}$$

and with the resonant frequency:

$$\omega_0 = \sqrt{\frac{g_{m1} \cdot g_{m2}}{(C_1 + C_3) \cdot C_2}}$$

The variable $\omega_0$ can be adjusted by regulation of $g_{m1}$ and $g_{m2}$. The quality coefficient is such that:

$$Q = \frac{\sqrt{(C_1 + C_3) \cdot C_2}}{k \cdot (C_1 + C_3) - C_3} \cdot \sqrt{\frac{g_{m1}}{g_{m2}}}.$$

By choosing $C_1$, $C_2$ and $C_3$ according to the following relationships: $C_1 = m \cdot C_0$, $C_2 = C_0$, and $C_3 = (1-m) \cdot C_0$, the following transfer function is obtained:

$$\frac{v_s}{v_e} = \frac{C_1}{C_0 \cdot (k - 1 + m)} \cdot \frac{\frac{C_0 \cdot (k - 1 + m)}{g_{m1}} \cdot p}{\frac{C_0^2}{g_{m1} \cdot g_{m2}} \cdot p^2 + \frac{C_0 \cdot (k - 1 + m)}{g_{m1}} \cdot p + 1}$$

The following resonant frequency and quality coefficient are determined as follows:

$$\omega_0 = \frac{\sqrt{g_{m1} \cdot g_{m2}}}{C_0}$$

$$Q = \frac{1}{k - 1 + m} \cdot \sqrt{\frac{g_{m1}}{g_{m2}}}$$

The choice of k and m allows one easily to obtain a high quality coefficient while at the same time keeping the values of the capacitors close to one another. At resonance ($\omega = \omega_0$), the voltage $v_{c1}$ is such that $$\left|\frac{v_{c1}}{v_e}\right| = \sqrt{\left(\frac{k \cdot m}{k - 1 + m}\right)^2 + m^2 \cdot Q^2}$$

and as:

$$\left(\frac{k \cdot m}{k - 1 + m}\right)^2 \ll m^2 \cdot Q^2$$

then $$\left|\frac{v_{c1}}{v_e}\right| \approx m \cdot Q$$

It is therefore possible to limit the value of the overvoltage, at resonance, at the intermediate node 13 by choosing m sufficiently small.

For choosing the parameters k and m, the following discussion is provided. The parameter k defines the division ratio in the bridge for resistances R1, R2: $k=R2/(R1+R2)$. Possible values for R1 and R2 are the following:

$1 k\Omega < R1 < 20 \, k\Omega$ $1 k\Omega < R2 < 20 \, k\Omega$.

The parameter m defines the ratio between the values of the three capacitor $C_1$, $C_2$ and $C_3$:

$C_1 = m \cdot C_0$ $C_2 = C_0$ $C_3 = (1-m) \cdot C_0$

One may also write: $C_1/C_2 = m$ and $C_3/C_2 = 1-m$. When $m=0.5$, the values of the capacitor are closest ($C_1 = C_3 = C_2/2$) and one therefore obtains the best matching.

With $|v_{c1}/v_e| = mQ$ (see above), one must take m to be as small as possible to minimize $|v_{c1}/v_e|$. In practice, one can advantageously choose that $0.1 < m < 0.5$. The choice of m is determined by the precision of the matching of the capacitors and the overvoltage of $v_{c1}$.

The value of k in relation to the quality coefficient Q will now be defined. Q is of the form $Q = P(1/Z)$, where P=the square root of the ratio of the values of gm and $Z=1/(k-1+m)$. Q becomes very large for $Z \to 0 \to k \to 1-m$.

$$k=R1/(R1+R2) \to 0<k<1.$$

It follows that: $1-m<k<1$.

In theory, it is possible to obtain very large quality coefficients Q (k close to 1−m), but the uncertainty regarding the value of Q then becomes important because the values of k, which is a ratio of resistances, and of m, which is a ratio of capacitances, are not matched. That is, there is a difference between the resistances and the capacitors in how they are produced. In practice, one advantageously chooses $1.1(1-m)<k<0.9$.

In one embodiment of the present invention, the advantages of the bandpass filter of the invention can be illustrated using the following filter characteristics $F_0=5$ MHz, $Q=20$ and $g_{m1}=4, g_{m2}=400$ μA/V. With the filter the prior art filter illustrated in FIG. 1, one obtains:

$$Q = \sqrt{\frac{g_{m1} \cdot C_2}{g_{m2} \cdot C_1}}$$

so, therefore:

$$\sqrt{\frac{C_2}{C_1}} = \frac{Q}{2} = 10$$

$$\frac{C_1}{C_2} = 100$$

$$C_1 \cdot C_2 = \frac{g_{m1} \cdot g_{m2}}{\omega_0^2}$$

and, therefore:

$$C_1 = 10 \cdot \frac{\sqrt{g_{m1} \cdot g_{m2}}}{\omega_0} = 64 \text{pF}$$

$$C_2 = \frac{1}{10} \cdot \frac{\sqrt{g_{m1} \cdot g_{m2}}}{\omega_0} = 0.64 \text{pF}$$

It is difficult to obtain good matching precision between the two capacitors $C_1$ and $C_2$ and with the resonant frequency. The input dynamic range is limited to a twentieth of the output dynamic range of the first transconductor 10. With the filter of the invention illustrated in FIG. 2, one obtains:

$$Q = \frac{1}{k-1+m} \cdot \sqrt{\frac{g_{m1}}{g_{m2}}}$$

therefore: $k=1.1-m$
By choosing: $m=0.2 \to k=0.9$ $$C_0 = \frac{\sqrt{g_{m1} \cdot g_{m2}}}{\omega_0} = 6.4 \text{pF}$$

$C_1 = m \cdot C_0 = 1.3$ pF
$C_2 = C_0 = 6.4$ pF
$C_3 = (1-m) \cdot C_0 = 5$ pF The values of the capacitors are close to one another ($C_2=5 \times C_1$) and their sum and, therefore, their equivalent surface in an integrated form on a silicon substrate is much less than in the preceding case (ratio of ⅕ and m*Q=4). The input dynamic is, therefore, only limited to a quarter of the output dynamic of the first transconductor 10.

That which is claimed:

1. A bandpass filter comprising:
   a first capacitor connected to an input terminal of the bandpass filter;
   an output terminal;
   a first transconductor having a first input connected to a voltage reference;
   a second transconductor having a first input connected to an output of said first transconductor and to said first capacitor, and a second input;
   a second capacitor connected between the first voltage reference and an output of second transconductor;
   a monitor amplifier having an input connected to said second capacitor and to the output of said second transconductor, and an output connected to the output terminal of the bandpass filter;
   a third capacitor connected between the second input of said first transconductor and the output of said first transconductor; and
   a splitter bridge comprising a plurality of resistors connected in series between the output terminal of the bandpass filter and the voltage reference at a node, and the node connected to the second input of said second transconductor.

2. A bandpass filter according to claim 1, wherein said plurality of resistors comprises a first resistor and a second resistance, said first resistor being connected between the second input of said second transconductor and a point common to the second input of said first transconductor and the output terminal of the bandpass filter, and said second resistor being connected to the second input of said second transconductor and the voltage reference.

3. A bandpass filter according to claim 1, wherein respective values of said first, second and third capacitors ($C_0$, $C_1$, and $C_2$) comprises a value according to the following relations: $C_1=m * C_0$, $C_2=C_0$, $C_3=(1-m) * C_0$, and $0.1<m<0.5$.

4. A bandpass filter according to claim 2, wherein said first resistor has a value R1 and said second resistor has a value R2 according to the following relations: $0.1<m<0.5$, $1.1(1-m)<k<0.9$, with $k=R2/(R1+R2)$.

5. A bandpass filter comprising:
   a first capacitor connected to an input terminal of the bandpass filter;
   an output terminal;
   a first transconductor having a first input connected to a voltage reference;
   a second transconductor having a first input connected to an output of said first transconductor and to said first capacitor, and a second input;
   a second capacitor connected between the voltage reference and an output of second transconductor;
   a monitor amplifier having an input connected to said second capacitor and to the output of said second transconductor, and an output connected to the output terminal of the bandpass filter;
   a third capacitor connected between the second input of said first transconductor and the output of said first transconductor; and
   a voltage divider comprising a plurality of resistors connected in series between the output terminal of the bandpass filter and the voltage reference at a node, and the node connected to the second input of said second transconductor.

6. A bandpass filter according to claim 5, wherein said plurality of resistors comprises a first resistor and a second resistor, said first resistor being connected between the second input of said second transconductor and a point common to the second input of said first transconductor and the output terminal of the bandpass filter, and said second resistor being connected to the second input of said second transconductor and the first reference.

7. A bandpass filter according to claim 5, wherein respective values of said first, second and third capacitors ($C_0$, $C_1$, and $C_2$) comprises a value according to the following relations: $C_1 = m * C_0$, $C_2 = C_0$, $C_3 = (1-m) * C_0$, and $0.1 < m < 0.5$.

8. A bandpass filter according to claim 6, wherein said first resistor has a value R1 and said second resistor has a value R2 according to the following relations: $0.1 < m < 0.5$, $1.1(1-m) < k < 0.9$, with $k = R2(R1+R2)$.

9. A television processing circuit comprising:
a bandpass filter having an input terminal for receiving a composite video signal, and an output terminal for providing a chrominance signal; and
a chrominance demodulator connected to the output terminal of said bandpass filter;
said bandpass filter comprising
a first capacitor connected to the input terminal for receiving the composite video signal,
a first transconductor having a first input connected to a first voltage reference,
a second transconductor having a input connected to an output of said first transconductor and to said first capacitor, and a second input,
a second capacitor connected between the voltage reference and an output of said second transconductor,
a monitor amplifier having an input connected to said second capacitor and to the output of said second transconductor, and an output connected to the output terminal of said bandpass filter,
a third capacitor connected between the second input of said first transconductor and the output of said first transconductor, and
a splitter bridge comprising a plurality of resistors connected in series between the output terminal of the bandpass filter and the voltage reference at a node, and the node connected to the second input of said second transconductor.

10. A television processing circuit according to claim 9, wherein said plurality of resistors comprises a first resistor and a second resistance, said first resistor being connected between the second input of said second transconductor and a point common to the second input of said first transconductor and the output terminal of said bandpass filter, and said second resistance being connected to the second input of said second transconductor and the first voltage reference.

11. A television processing circuit according to claim 9, wherein respective values of said first, second and third capacitors ($C_0$, $C_1$, and $C_2$) comprises a value according to the following relations: $C_1 = m * C_0$, $C_2 = C_0$, and $C_3 = (1-m) * C_0$.

12. A television processing circuit according to claim 10, wherein said first resistor has a value R1 and said second resistor has a value R2 according to the following relations: $0.1 < m < 0.5$, $1.1(1-m) < k < 0.9$, with $k = R2/(R1+R2)$.

13. A method for making a bandpass filter of a type comprising a first capacitor connected to an input terminal of the bandpass filter, a first transconductor having a first input connected to a first reference, a second transconductor having a first input connected to an output of the first transconductor and to the first capacitor, and a second input, a second capacitor connected between a voltage reference and an output of the said second transconductor, and a monitor amplifier having an input connected to the second capacitor and to the output of the second transconductor, and an output connected to the output terminal of the bandpass filter, the method comprising the steps of:
connecting a third capacitor between the second input of the first transconductor and the output of the first transconductor; and
connecting a voltage divider comprising a plurally of resistors connected in series between the output terminal of the bandpass filter and the voltage reference at a node, and connecting the node to the second input of the second transconductor.

14. A method according to claim 13, wherein the plurality of resistors comprises a first resistor and a second resistor; wherein connecting the splitter bridge comprises the steps of connecting the first resistance between the second input of the second transconductor and a point common to the second input of the first transconductor and the output of the filter, and connecting the second resistor to the second input of the second transconductor and the first voltage reference.

15. A method according to claim 13, wherein respective values of the first, second and third capacitors ($C_0$, $C_1$, and $C_2$) comprises a value according to the following relations: $C_1 = m * C_0$, $C_2 = C_0$, $C_3 = (1-m) * C_0$, and $0.1 < m < 0.5$.

16. A method according to claim 14, wherein the first resistance has a value R1 and the second resistor has a value R2 according to the following relations: $0.1 < m < 0.5$, $1.1(1-m) < k < 0.9$, with $k = R2/(R1+R2)$.

* * * * *

UNITED STATES PATENT AND TRADEMARK OFFICE
CERTIFICATE OF CORRECTION

PATENT NO. : 6,181,197 B1
DATED : January 30, 2001
INVENTOR(S) : Gerard Bret, Pascal Debaty It is certified that error appears in the above-identified patent and that said Letters Patent is hereby corrected as shown below:

Cover Sheet, (30)
Foreign Application
Priority Data
Delete: "May 5, 1998"
Insert —May 11, 1998—

Column 2, Line 27
Delete: "$C_1$ and C2"
Insert —$C_1$ and $C_2$—

Column 2, Line 35
Delete: "$v_{c1}$ this"
Insert: —$v_{c1}$ at this—

Column 6, Line 12
Delete: "the first voltage"
Insert —the voltage—

Column 6, Line 29
Delete: "resistance"
Insert: —resistor—

Column 7, Line 17
Delete: "R2(R1+R2).
Insert: —R2/(R1+R2).—

Column 7, Line 29
Delete: "a first voltage"
Insert: —a voltage—

Column 7, Line 30
Delete: "a input"
Insert —a first input—

Coulmn 7, Line 49
Delete: "resistance"
Insert —resistor—

UNITED STATES PATENT AND TRADEMARK OFFICE
CERTIFICATE OF CORRECTION

PATENT NO. : 6,181,197 B1
DATED : January 30, 2001
INVENTOR(S) : Gerard Bret, Pascal Debaty It is certified that error appears in the above-identified patent and that said Letters Patent is hereby corrected as shown below:

Column 8, Line 37      Delete: "resistance"
                                   Insert —resistor—

Column 8, Line 40      Delete: "the first voltage"
                                   Insert —the voltage—

Column 8, Line 46      Delete: "resistance"
                                   Insert —resistor—

Column 8, line 3       Delete: "resistance"
                                   Insert —resistor—

Column 8, Line 29      Delete: "plurally"
                                   Insert —plurality—

Signed and Sealed this

Fifth Day of June, 2001

*Attest:*

*Attesting Officer*

NICHOLAS P. GODICI
*Acting Director of the United States Patent and Trademark Office*